United States Patent
Jeong

(10) Patent No.: US 9,435,851 B2
(45) Date of Patent: Sep. 6, 2016

(54) SEMICONDUCTOR APPARATUS

(71) Applicant: SK hynix Inc., Icheon-si Gyeonggi-do (KR)

(72) Inventor: Chun Seok Jeong, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/567,853

(22) Filed: Dec. 11, 2014

(65) Prior Publication Data

US 2016/0072479 A1    Mar. 10, 2016

(30) Foreign Application Priority Data

Sep. 5, 2014 (KR) .......................... 10-2014-0118846

(51) Int. Cl.
*H03K 3/00* (2006.01)
*G01R 31/28* (2006.01)
*H03K 3/03* (2006.01)

(52) U.S. Cl.
CPC ......... *G01R 31/2851* (2013.01); *H03K 3/0315* (2013.01)

(58) Field of Classification Search
None
See application file for complete search history.

(56) References Cited

U.S. PATENT DOCUMENTS

2013/0246873 A1* 9/2013 Whetsel ......... G01R 31/318536 714/727
2013/0262943 A1* 10/2013 Lakshmipathy G01R 31/318541 714/726
2014/0019818 A1* 1/2014 Jindal ................. G06F 11/2215 714/724

FOREIGN PATENT DOCUMENTS

KR    1020140038737 A    3/2014

* cited by examiner

*Primary Examiner* — Long Nguyen
(74) *Attorney, Agent, or Firm* — William Park & Associates Ltd.

(57) ABSTRACT

A semiconductor apparatus includes a command decoding unit configured to decode an internal command, an internal clock and an internal clock enable signal, and generate an internal control signal; a clock enable signal control unit configured to receive a pre-clock enable signal and output one of the pre-clock enable signal and an enabled internal clock enable signal as the internal clock enable signal in response to a first test signal; an enable signal selection unit configured to output one of the pre-clock enable signal and a second to test signal as a counting enable signal in response to the first test signal; and a counting unit configured to perform a counting operation during an enable period of the counting enable signal, and output a counting code.

18 Claims, 4 Drawing Sheets

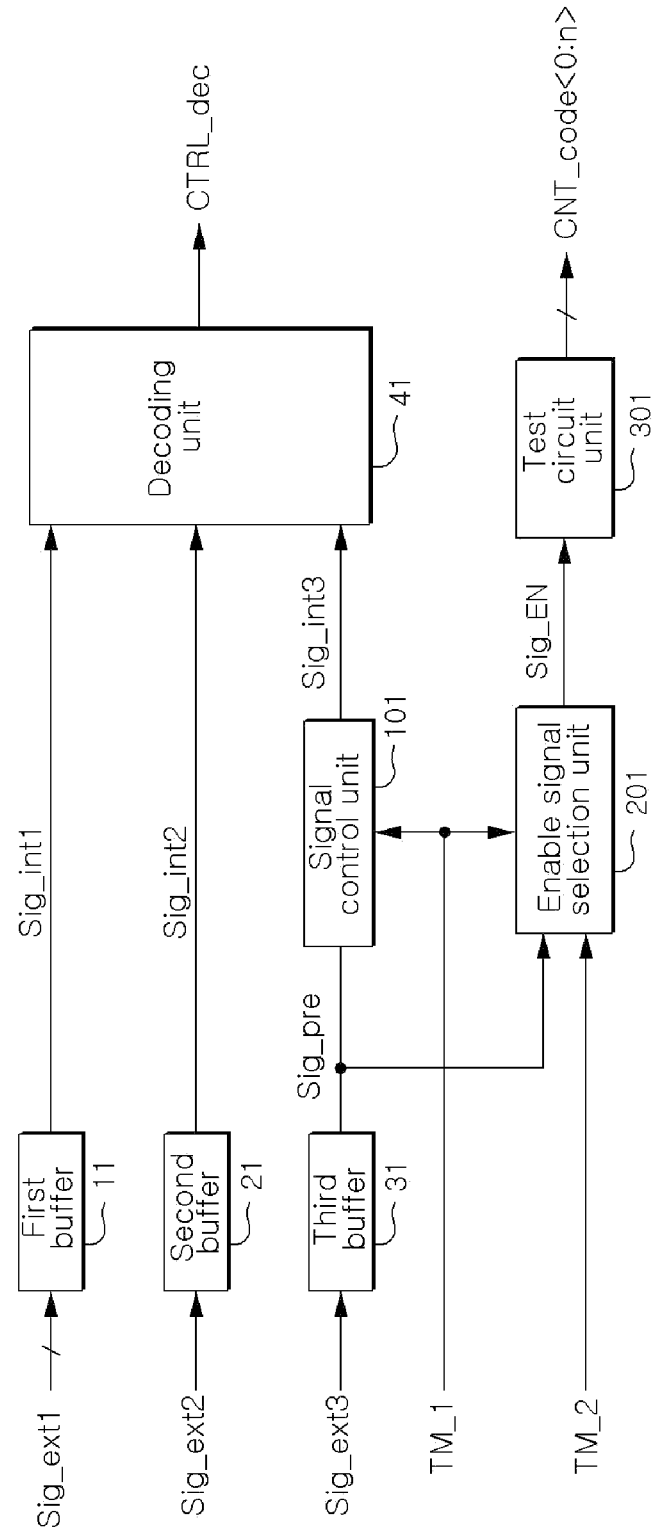

SEMICONDUCTOR APPARATUS

CROSS-REFERENCES TO RELATED APPLICATION

The present application claims priority under 35 U.S.C. §119(a) to Korean application number 10-2014-0118846 filed on Sep. 5, 2014, in the Korean Intellectual Property Office, which is incorporated herein by reference in its entirety.

BACKGROUND

1. Technical Field

Embodiments of the present invention generally relate to an integrated circuit, and more particularly, in one or more embodiments, to a semiconductor apparatus.

2. Related Art

Electronic devices include various integrated circuits therein. For example, an electronic device may include a semiconductor apparatus and a controller for controlling the semiconductor apparatus. The semiconductor apparatus may operate by receiving control signals from the controller.

A semiconductor apparatus may be manufactured through multiple processing steps during which electronic circuits are formed on a wafer. Once all the processing steps are completed, each semiconductor apparatus is separated from a wafer. Before separating the semiconductor apparatus from the wafer, a wafer test may be performed to verify that the wafer has not been damaged by previous processing steps. The wafer testing may be performed using a wafer prober.

After separating the semiconductor apparatus from the wafer, a packaging process is performed by mounting the semiconductor apparatus and connecting it to the pins on the package. After the packaging process is performed, a test process using control signals applied from an external control device to the semiconductor apparatus may be performed instead of using the wafer prober.

SUMMARY

In an embodiment, a semiconductor apparatus may include: a command decoding unit configured to decode an internal command, an internal clock and an internal clock enable signal, and generate an is internal control signal; a clock enable signal control unit configured to output a pre-clock enable signal as the internal clock enable signal or retain the internal clock enable signal in an enabled state, in response to a first test signal; an enable signal selection unit configured to output one of the pre-clock enable signal and a second test signal as a counting enable signal in response to the first test signal; and a counting unit configured to perform a counting operation during an enable period of the counting enable signal, and output a counting code.

In an embodiment, a semiconductor apparatus may include: a first buffer configured to buffer a first external signal and generate a first internal signal; a second buffer configured to buffer a second external signal and generate a pre-signal; a signal control unit configured to output the pre-signal as a second internal signal or enable the second internal signal, in response to a first test signal; a decoding unit configured to decode the first and second internal signals, and generate an internal control signal; an enable signal selection unit configured to output the pre-signal or a second test signal as an enable signal in response to the first test signal; and a test circuit unit configured to perform a test operation in response to the enable signal.

BRIEF DESCRIPTION OF THE DRAWINGS

FIG. 5 is a configuration diagram illustrating an example of a semiconductor apparatus in accordance with an embodiment of the present invention.

DETAILED DESCRIPTION

Figure 1:
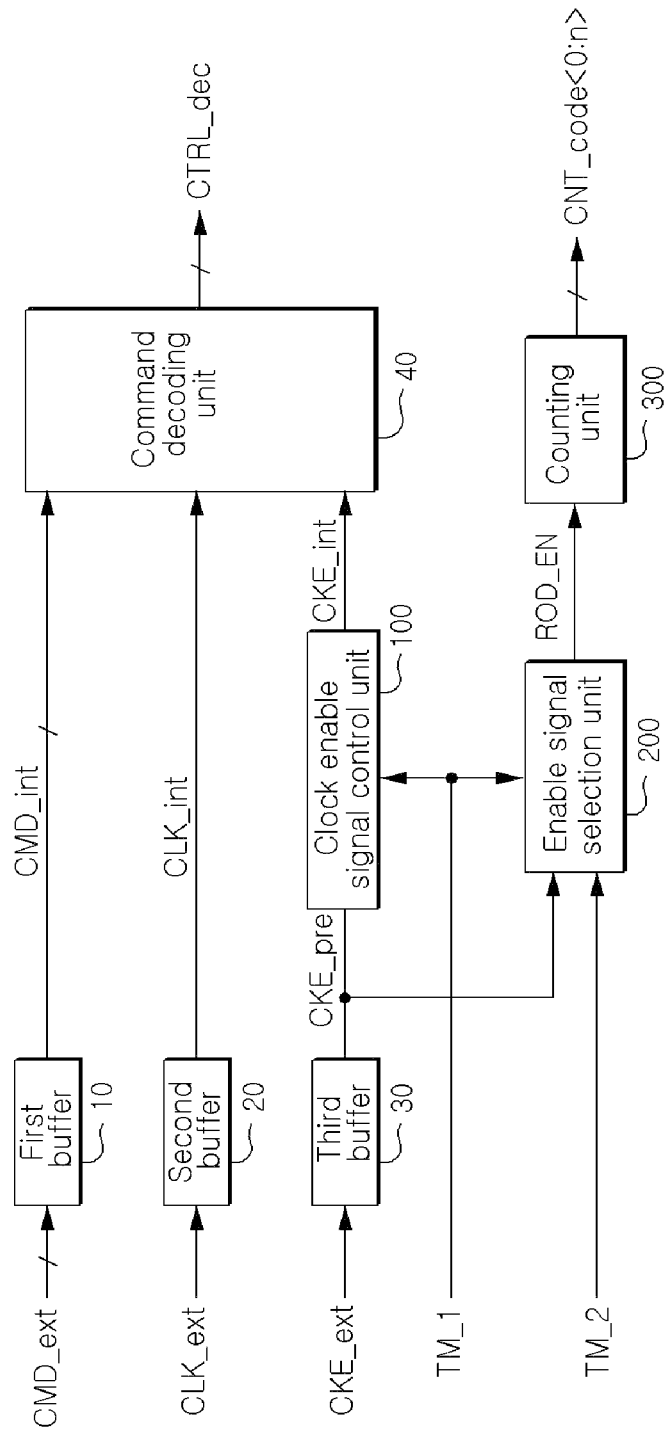
FIG. 1 is a configuration diagram illustrating an example of a semiconductor apparatus in accordance with an embodiment of the is present invention.

FIG. 1 is a configuration diagram illustrating an example of a semiconductor apparatus in accordance with an embodiment of the present invention.

As shown in FIG. 1, a semiconductor apparatus in accordance with an embodiment of the present invention may include first to third buffers 10, 20 and 30, a command decoding unit 40, a clock enable signal control unit 100, an enable signal selection unit 200, and a counting unit 300.

The first buffer 10 receives an external command CMD_ext, and outputs an internal command CMD_int.

The second buffer 20 receives an external clock CLK_ext, and outputs an internal clock CLK_int.

The third buffer 30 receives an external clock enable signal CKE_ext, and outputs a pre-clock enable signal CKE_pre.

The clock enable signal control unit 100 receives the pre-clock enable signal CKE_pre and outputs an internal clock enable signal CKE_int. The internal clock enable signal CKE_int outputted from the clock enable signal control unit 100 may vary depending on a first test signal TM_1. For example, the clock enable signal control unit 100 may output either the pre-clock enable signal CKE_pre as the internal clock enable signal CKE_int or the internal clock enable signal CKE_int which is in an enabled state in response to the first test signal TM_1. In an embodiment of the present invention, the enabled state may include a logic high level. For example, the clock enable signal control unit 100 outputs the pre-clock enable signal CKE_pre as the internal clock enable signal CKE_int when the first test signal TM_1 is disabled, and enables the internal clock enable signal CKE_int regardless of the pre-clock enable signal CKE_pre when the first test signal TM_1 is enabled.

The command decoding unit 40 decodes the internal command CMD_int, the internal clock CLK_int and the internal clock enable signal CKE_int, and generates an internal control signal CTRL_dec. The command decoding unit 40 may generate the internal control signal CTRL_dec by decoding the internal command CMD_int, the internal clock CLK_int and the internal clock enable signal CKE_int. The internal control signal CTRL_dec is used as a signal for controlling operations of the semiconductor apparatus.

The enable signal selection unit 200 outputs one of the pre-clock enable signal CKE_pre and a second test signal TM_2 as a counting enable signal ROD_EN in response to the first test signal TM_1. For example, the enable signal selection unit 200 outputs the pre-clock enable signal CKE_pre as the counting enable signal ROD_EN when the first test signal TM_1 is enabled, and outputs the second test signal TM_2 as the counting enable signal ROD_EN when the first test signal TM_1 is disabled. The enable signal selection unit 200 may include a multiplexer.

The counting unit 300 performs a counting operation during the enable period of the counting enable signal ROD_EN, and generates a counting code CNT_code<0:n>.

Figure 2:
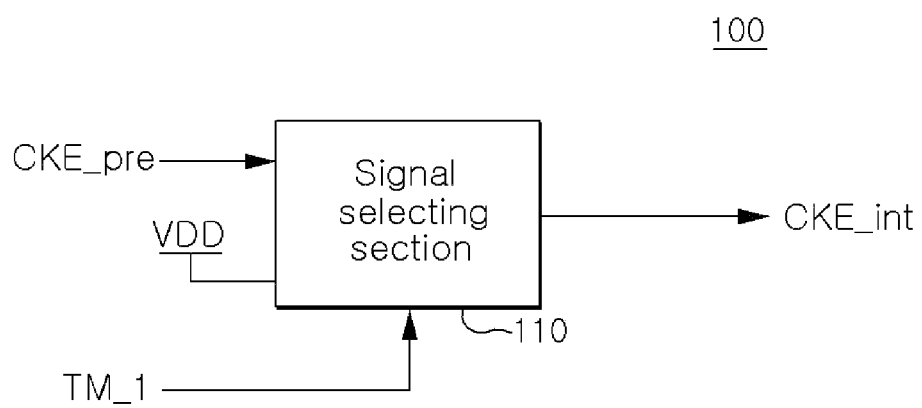
FIG. 2 is a configuration diagram illustrating an example of the clock enable signal control unit shown in FIG. 1.

As shown in FIG. 2, the clock enable signal control unit 100 includes a signal selecting section 110.

The signal selecting section 110 outputs one of the pre-clock enable signal CKE_pre and an external voltage VDD as the internal clock enable signal CKE_int in response to the first test signal TM_1. For example, the signal selecting section 110 outputs the pre-clock enable signal CKE_pre as the internal clock enable signal CKE_int when the first test signal TM_1 is disabled, and outputs the external voltage VDD as the internal clock enable signal CKE_int when the first test signal TM_1 is enabled. The signal selecting section 110 may include a multiplexer.

Figure 3:
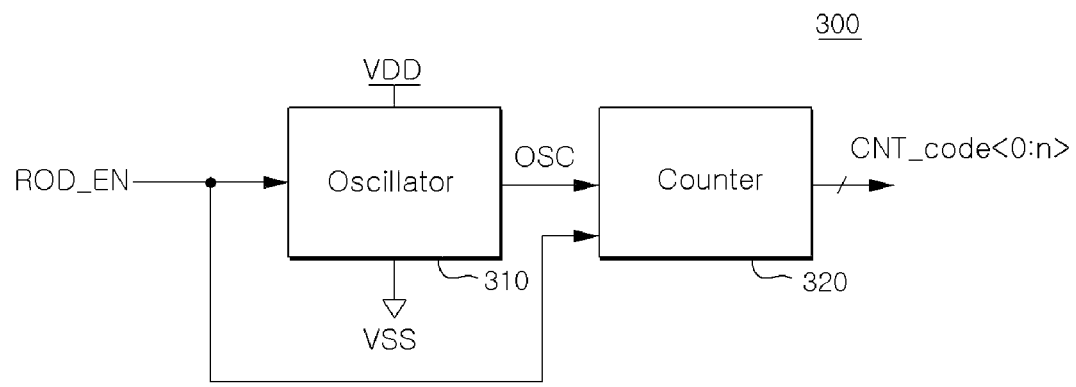
FIG. 3 is a configuration diagram illustrating an example of the counting unit shown in FIG. 1.

As shown in FIG. 3, the counting unit 300 includes an oscillator 310 and a counter 320.

The oscillator 310 generates an oscillator signal OSC when the counting enable signal ROD_EN is enabled. The oscillator 310 may receive the power supply voltage such as the external voltage VDD and a ground voltage VSS and generate the oscillator signal OSC when the counting enable signal ROD_EN is enabled. The external voltage VDD may be a voltage level that power-supply pins connected to the semiconductor apparatus carry.

The counter 320 may measure the number of transitions of the oscillator signal OSC. In an embodiment of the present invention, when the counting enable signal ROD_EN is enabled, the counter 320 may count the number of times the oscillator signal OSC has transitioned to a predetermined level when the counting enable signal ROD_EN is enabled, and generate the counting code CNT_code<0:n>. For example, when the counting enable signal ROD_EN is enabled, the counter 320 may count the number of times the oscillator signal OSC has transitioned to a logic high level and output the counting code CNT_code<0:n>.

Figure 4:
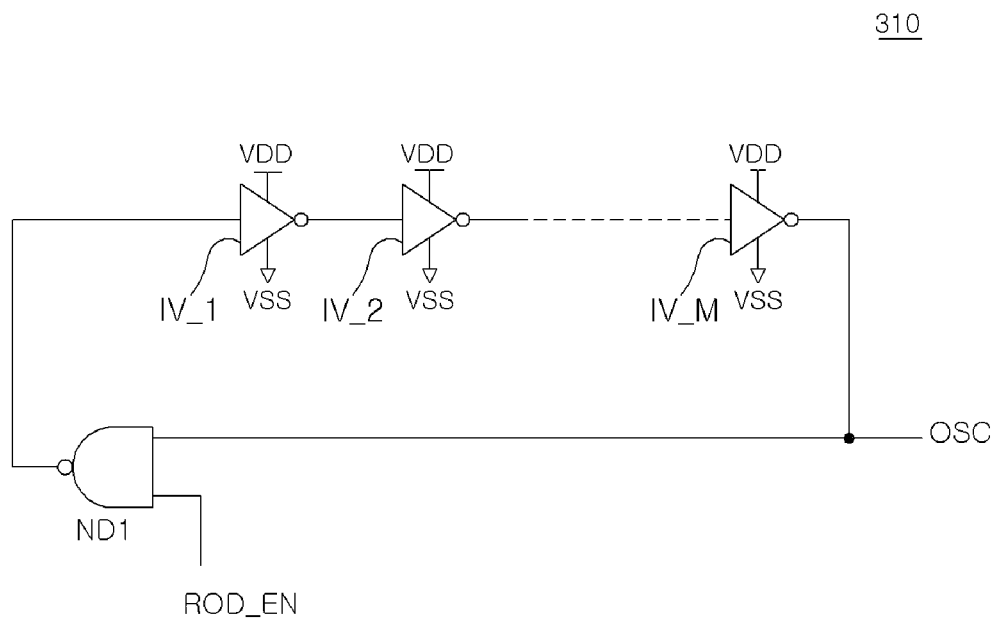
FIG. 4 is a configuration diagram illustrating an example of the oscillator shown in FIG. 3.

As shown in FIG. 4, the oscillator 310 includes a plurality of inverters IV_1 to IV_M, which are electrically coupled in series, and a NAND gate ND1.

The plurality of inverters IV_1 to IV_M may be electrically coupled in series. The plurality of inverters IV_1 to IV_M may include a first inverter IV_1 at an input end of the plurality of inverters IV_1 to IV_M and a second inverter IV_M at an output end of plurality of inverters IV_1 to IV_M. The plurality of inverters IV_1 to IV_M may also include more inverters between the first and second inverters IV_1 and IV_M. Each of the plurality of inverters IV_1 to IV_M may use the external voltage VDD and the ground voltage VSS as power supply voltages. For example, the NAND gate ND1 may receive an output signal of the second inverter IV_M and the counting enable signal ROD_EN. The output signal of the NAND gate ND1 may be inputted to the first inverter IV1. In an embodiment of the present invention, the output signal of the second inverter IV_M is the oscillator signal OSC.

The semiconductor apparatus in accordance with an embodiment of the present invention may operate as follows.

Before separating the semiconductor apparatus from the wafer, the semiconductor apparatus may be tested by using a wafer prober to see if it function as it was designed to. After a packaging process is performed, however, the wafer prober cannot be used any longer, and thus the semiconductor apparatus may be tested using signals applied from an external device. For example, the semiconductor apparatus may be tested using preset information stored in a mode register set.

Information regarding a test mode, which is stored in the mode register set, may place the semiconductor apparatus in a test mode. When the semiconductor apparatus is in the test mode, it may be tested by using a test signal. In the test mode, the semiconductor apparatus can only be tested in a limited number of situations. For example, once the test signal is set in the mode register set, a point of time when the test signal transitions may not be changed. If the is test signal can be used only in the test mode, the semiconductor apparatus in a normal-operation mode may not be tested without interrupting normal operations which is being performed and entering the test mode.

In an embodiment of the present invention, the semiconductor apparatus may be tested even in a normal-operation mode without stopping the normal operations.

The first to third buffers 10, 20 and 30 receive respectively the external command CMD_ext, the external clock CLK_ext and the external clock enable signal CKE_ext which are inputted from an external device (e.g., a controller), and output respectively the internal command CMD_int, the internal clock CLK_int and the pre-clock enable signal CKE_pre.

The clock enable signal control unit 100 receives the pre-clock enable signal CKE_pre and outputs an internal clock enable signal CKE_int. The internal clock enable signal CKE_int outputted from clock enable signal control unit 100 may vary depending on a first test signal TM_1. For example, the clock enable signal control unit 100 may output the pre-clock enable signal CKE_pre as an internal clock enable signal CKE_int when the first test signal TM_1 to has a first value, and may output an internal clock enable signal CKE_int which has a preset value, when the first test signal TM_1 has a second value, regardless of the pre-clock enable signal CKE_pre. For example, the clock enable signal control unit 100 may output an internal clock enable signal CKE_int which is in an enabled state in response to the first test signal TM_1.

The enable signal selection unit 200 outputs the pre-clock enable signal CKE_pre or the second test signal TM_2 as the counting enable signal ROD_EN in response to the first test signal TM_1.

The counting unit 300 generates the counting code CNT_code<0:n> during the enable period of the counting enable signal ROD_EN. The counting unit 300 includes the oscillator 310 which generates the oscillator signal OSC by using the external voltage VDD, and the counter 320 which counts the number of transitions of the oscillator signal OSC.

The semiconductor apparatus in accordance with an embodiment of the present invention may monitor whether a voltage drop of the external voltage VDD occurs.

For example, the semiconductor apparatus may monitor the external voltage VDD as follows. First, the first test signal TM_1 is enabled, and the enabled state thereof is retained. The first test signal TM_1 may be enabled by controlling the mode register set.

If the first test signal TM_1 is enabled, the clock enable signal control unit 100 enables the internal clock enable signal CKE_int regardless of the pre-clock enable signal CKE_pre or the to external clock enable signal CKE_ext.

In the state in which the internal clock enable signal CKE_int is enabled, the external command CMD_ext inputted from the external device is inputted as the internal command CMD_int to the command decoding unit 40, and the external clock CLK_ext is inputted as the internal clock CLK_int to the command decoding unit 40.

The command decoding unit 40 generates the internal control signal CTRL_dec in response to the internal command CMD_int, the internal clock CLK_int, and the internal clock enable signal CKE_int which is enabled. The internal control signal CTRL_dec controls the operation of the semiconductor apparatus. Accordingly, the semiconductor apparatus may be controlled by the external device.

In an embodiment of the present invention, the enable signal selection unit 200 outputs the pre-clock enable signal CKE_pre as the counting enable signal ROD_EN when the first test signal TM_1 is enabled.

The counting unit 300 generates the counting code CNT_code<0:n> during the enable period of the counting enable signal ROD_EN.

The semiconductor apparatus in accordance with an embodiment of the present invention may be tested by using the counting unit 300 even in a normal-operation mode in which such operations as read or write operation are performed. In an embodiment of the present invention, when the counting unit 300 is operated to test the semiconductor apparatus in a normal-operation mode, the external clock enable signal CKE_ext which is inputted from the external device. As a consequence, while the external device is controlling the normal operation of the semiconductor is apparatus and the normal operations are being performed with the internal clock enable signal CKE_int, a test for monitoring the voltage level of the external voltage VDD which is being used by the semiconductor apparatus may be performed by operating the counting unit 300.

In the semiconductor apparatus in accordance with an embodiment of the present invention, if the first test signal TM_1 is disabled, the command decoding unit 40 operates in response to the external command CMD_ext, the external clock CLK_ext and the external clock enable signal CKE_ext, which are the external signals inputted from the external device, and the counting unit 300 may be operated in response to the second test signal TM_2 which is outputted from the mode register set.

The semiconductor apparatus in accordance with an embodiment of the present invention may operate the command decoding unit 40 and the counting unit 300 not only by using the external signals inputted from the external device for both the command decoding unit 40 and the counting unit 300 but also by using the external signals for the command decoding unit 40 and the output signal of the mode register set for the counting unit 300.

As shown in FIG. 5, a semiconductor apparatus in accordance with an embodiment of the present invention may include first to third buffers 11, 21 and 31, a decoding unit 41, a signal control unit 101, an enable signal selection unit 201, and a test circuit unit 301.

The first buffer 11 receives a first external signal Sig_ext1, and outputs a first internal signal Sig_int1.

The second buffer 21 receives a second external signal Sig_ext2, and outputs a second internal signal Sig_int2.

The third buffer 31 receives a third external signal Sig_ext3, and outputs a pre-signal Sig_pre.

The signal control unit 101 receives the pre-signal Sig_pre and output a third internal signal Sig_int3. The third internal signal Sig_int3 outputted from the signal control unit 101 may vary depending on a first test signal TM_1. For example, the signal control unit 101 may either output the pre-signal Sig_pre as the third internal signal Sig_int3 or enable the third internal signal Sig_int3 in response to a first test signal TM_1. The signal control unit 101 may be configured in the same manner as the clock enable signal control unit 100 of FIG. 2 except that the signals inputted thereto and the signal outputted therefrom are different.

The decoding unit 41 decodes the first to third internal signals Sig_int1, Sig_int2 and Sig_int3, and generates an internal control signal CTRL_dec. The decoding unit 41 may generate internal control signal CTRL_dec by decoding the first to third internal signals Sig_int1, Sig_int2 and Sig_int3.

The enable signal selection unit 201 outputs one of the pre-signal Sig_pre and a second test signal TM_2 as a test circuit unit enable signal ("enable signal") Sig_EN in response to the first test signal TM_1. The enable signal selection unit 201 may include a is multiplexer.

The test circuit unit 301 performs a test operation when the enable signal Sig_EN is enabled. For example, when the enable signal Sig_EN is enabled, the test circuit unit 301 may monitor whether a voltage drop of an operating voltage of the semiconductor apparatus occurs. The test circuit unit 301 may include, as shown in FIG. 3, an oscillator 310 which may operate using the external voltage VDD, and a counter 320 which counts the number of the output signals of the oscillator 310. The test circuit unit 301 may generates a code representing a voltage level of an external voltage that is being used in the semiconductor apparatus.

The semiconductor apparatus in accordance with an embodiment of the present invention may be tested by operating the test circuit unit 301 while the semiconductor apparatus is operating in a normal-operation mode by generating the internal control signal CTRL_dec using only the external signals inputted from an exterior.

While various embodiments have been described above, it will be understood to those skilled in the art that the embodiments described are by way of example only. Accordingly, the semiconductor apparatus described herein should not be limited to based on the described embodiments.

What is claimed is:

1. A semiconductor apparatus comprising:
   a command decoding unit configured to decode an internal command, an internal clock and an internal clock enable signal, and generate an internal control signal;
   a clock enable signal control unit configured to receive a pre-clock enable signal and output one of the pre-clock enable signal and an enabled internal clock enable signal as the internal clock enable signal in response to a first test signal;
   an enable signal selection unit configured to output one of the pre-clock enable signal and a second test signal as a counting enable signal in response to the first test signal; and
   a counting unit configured to perform a counting operation during an enable period of the counting enable signal, and output a counting code.

2. The semiconductor apparatus according to claim 1, further comprising:
   a first buffer configured to receive an external command and output the internal command;
   a second buffer configured to receive an external clock and output the internal clock; and
   a third buffer configured to receive an external clock enable signal and output the pre-clock enable signal.

3. The semiconductor apparatus according to claim 2, wherein the clock enable signal control unit outputs the pre-clock enable signal as the internal clock enable signal when the first test signal is disabled, and enables the internal clock enable signal regardless of the pre-clock enable signal when the first test signal is enabled.

4. The semiconductor apparatus according to claim 3, wherein the clock enable signal control unit comprises a signal selection unit which is configured to output the pre-clock enable signal as the internal clock enable signal when the first test signal is disabled and output an external voltage as a level of the internal clock enable signal when the first test signal is enabled.

5. The semiconductor apparatus according to claim 1, wherein the enable signal selection unit outputs the second test signal as the counting enable signal when the first test signal is disabled, and outputs the pre-clock enable signal as the counting enable signal when the first test signal is enabled.

6. The semiconductor apparatus according to claim 1, wherein the counting unit comprises:
an oscillator configured to generate an oscillator signal when the counting enable signal is enabled; and
a counter configured to count the number of times the oscillator signal transitions to a predetermined level, and generate the counting code.

7. The semiconductor apparatus according to claim 6, wherein the oscillator receives the external voltage to generate the oscillator signal.

8. A semiconductor apparatus comprising:
a first buffer configured to receive a first external signal and generate a first internal signal;
a second buffer configured to receive a second external signal and generate a pre-signal;
a signal control unit configured to output the pre-signal as a second internal signal or enable the second internal signal in response to a first test signal;
a decoding unit configured to receives the first and second internal signals and generate an internal control signal;
an enable signal selection unit configured to output one of the pre-signal and a second test signal as an enable signal in response to the first test signal; and
a test circuit unit configured to perform a test operation in response to the enable signal.

9. The semiconductor apparatus according to claim 8, wherein the signal control unit enables the second internal signal regardless of the pre-signal when the first test signal is enabled, and outputs the pre-signal as the second internal signal when the first test signal is disabled.

10. The semiconductor apparatus according to claim 8, wherein the enable signal selection unit outputs the pre-signal as the enable signal when the first test signal is enabled, and outputs the second test signal as the enable signal when the first test signal is disabled.

11. The semiconductor apparatus according to claim 8, wherein the test circuit unit generates a code representing a voltage level of an external voltage that is being used in the semiconductor apparatus.

12. The semiconductor apparatus according to claim 11, wherein the test circuit unit comprises:
an oscillator configured to generate an oscillator signal when the enable signal is enabled; and
a counter configured to count the number of times the oscillator signal transitions to a predetermined level.

13. The semiconductor apparatus according to claim 12, wherein the oscillator comprises:
a plurality of inverters electrically coupled in series and having a first inverter at an input end of the plurality of inverters and a second inverter at an output end of plurality of inverters; and
a NAND gate configured to receive an output signal of the second inverter and the enable signal and generate an output signal to the first inverter.

14. A semiconductor apparatus comprising:
a buffer configured to receive an external clock enable signal and outputs a pre-clock enable signal an enable signal selection unit configured to output one of the pre-clock enable signal and a test signal as a test circuit unit enable signal; and
a test circuit unit configured to perform a test operation during an enable period of the test circuit unit enable signal,
wherein the test operation includes a counting operation and the test circuit unit performs the counting operation during an enable period of the test circuit unit enable signal, and output a counting code.

15. The semiconductor apparatus according to claim 14, wherein the test circuit unit enable signal is enabled while the semiconductor apparatus is performing a normal operation.

16. The semiconductor apparatus according to claim 14, wherein the counting code represents a voltage level of an external voltage that is being used in the semiconductor apparatus.

17. The semiconductor apparatus according to claim 14, wherein the test circuit unit comprises:
an oscillator configured to generate an oscillator signal when the test circuit unit enable signal is enabled; and
a counter configured to count the number of times the oscillator signal transitions to a predetermined level.

18. The semiconductor apparatus according to claim 17, wherein the oscillator receives the external voltage to generate the oscillator signal.

* * * * *